(12) United States Patent
Kim et al.

(10) Patent No.: US 7,601,555 B2
(45) Date of Patent: Oct. 13, 2009

(54) WAFER INSPECTION SYSTEM AND METHOD THEREOF

(75) Inventors: Kwang-soo Kim, Yongin-si (KR);
Koung-su Shin, Suwon-si (KR);
Seung-min Choi, Suwon-si (KR);
Yu-han Jeong, Suwon-si (KR)

(73) Assignee: Samsung Electronics Co., Ltd, Suwon-si (KR)

( * ) Notice: Subject to any disclaimer, the term of this patent is extended or adjusted under 35 U.S.C. 154(b) by 444 days.

(21) Appl. No.: 11/132,352

(22) Filed: May 19, 2005

(65) Prior Publication Data
US 2005/0282299 A1 Dec. 22, 2005

(30) Foreign Application Priority Data
Jun. 18, 2004 (KR) .................... 10-2004-0045747

(51) Int. Cl.
*H01L 21/00* (2006.01)
(52) U.S. Cl. ..................................... 438/48
(58) Field of Classification Search ............... 257/306, 257/390, 393, 432, 499, 528, 532, 544, 618–620, 257/622–628, 678, 686, 684, 723–737, 772–775, 257/98–99, 103, 208, 243, 288–301; 702/117; 438/4–7, 13–14, 455–460, 129, 119, 618; 29/426.4, 841
See application file for complete search history.

(56) References Cited
U.S. PATENT DOCUMENTS
6,338,001 B1 1/2002 Steffan et al.

6,593,152 B2 * 7/2003 Nakasuji et al. ............... 438/14
2002/0187582 A1 * 12/2002 Satya et al. .................... 438/48
2003/0207475 A1 * 11/2003 Nakasuji et al. ............... 438/14

FOREIGN PATENT DOCUMENTS
KR 2001-30320 4/2001
KR 1020010039251 5/2001
KR 2001-53427 6/2001
KR 1020030083563 10/2003

OTHER PUBLICATIONS

Korean Office Action dated Jan. 26, 2006 of Korean Patent Application No. 10-2004-0045747.

* cited by examiner

*Primary Examiner*—Scott B. Geyer
*Assistant Examiner*—Andre Stevenson
(74) *Attorney, Agent, or Firm*—Stanzione & Kim, LLP

(57) ABSTRACT

A wafer inspection system includes an electrical testing part to control a probe to be in contact with a pad of a wafer to perform a predetermined electrical test, a defect detecting part to detect a defect in the wafer passing through the electrical test, a defect sorting part to sort the defect detected in the defect detecting part by an in-line method, and a defective determining part to determine whether the wafer is a defective according to a sorting result of the defect sorting part. The wafer inspection system and a method thereof can determine the kinds of the defect in the wafer during a fabricating procedure, so that it is possible to instantly and correctly determine whether the die on the wafer is a defective.

18 Claims, 11 Drawing Sheets

RANGE TO BE SUSPECTED AS PARTICLE

get correct information about the defect in the wafer by comparing the reference image with the defect image of the sample wafer.

WAFER INSPECTION SYSTEM AND METHOD THEREOF

CROSS-REFERENCE TO RELATED APPLICATIONS

This application claims the benefit of Korean Patent Application No. 2004-45747, filed on Jun. 18, 2004, in the Korean Intellectual Property Office, the disclosure of which is incorporated herein in its entirety by reference.

BACKGROUND OF THE INVENTION

1. Field of the Invention

The present invention relates to a wafer inspection system and a method thereof, and more particularly, to a wafer inspection system and a method thereof, in which a wafer defect is sorted by an in-line method.

2. Description of the Related Art

After a semiconductor chip (hereinafter, referred to as "die") is completed on a wafer through deposition, photolithography, etching, ion implantation, etc., an EDS (electrical die sorting) process is performed to test electrical performance of each die.

The EDS process includes a burn-in process to test the durability of the die, a pre-laser process applying an electrical current to the die to check a defective die according to operation states, and a laser repair process to scan and repair the defective die with a laser, etc.

In the pre-laser process of the EDS process, the electrical current is applied to the die by controlling a probe to be in contact with a pad of the die, thereby checking an operating state of the die. If the probe abnormally contacts the pad, a boundary line of the pad may be damaged, and an effective electrical test may not be expected. Hence, it is important to control the probe to come in contact with a center of the pad.

The wafer passing the electrical test is loaded on a defect inspection apparatus, which detects a defect in the loaded wafer and stores a position of the defect in the loaded wafer. The stored defect position is used in the following process of detecting a kind and a degree of the defect in each die. It is determined whether the die is a defective or not according to kinds and degrees of the detected defect.

However, in a conventional system for inspecting the wafer, an inspector subjectively determines the kinds and the degrees of the defect in the wafer through an electron microscope. Therefore, it is difficult to apply the same objective standard to all wafers because the defect is subjectively determined. Further, it takes too much time and effort to train an inspector to obtain a reliable inspection result.

There is a conventional inspection apparatus that samples the wafer during a fabricating procedure of the wafer and analyzes the kinds and causes of the defect in the sample wafer. However, this conventional inspection apparatus just uses a feedback from the analysis in the above process, but the feedback cannot be used in instantly determining whether the sample wafer is a defective or not. Further, this conventional inspection apparatus determines the kinds of the defect in the wafer by storing a partial image of a normal wafer as a reference image and comparing the reference image with a defect image of the sample wafer. Therefore, a position of the wafer must be correctly adjusted when the defect image of the sample wafer is photographed. Further, after a final fabricating procedure, a background image for the die and a circumference of the pad is very complicated, so that it is difficult to

SUMMARY OF THE INVENTION

In order to solve the foregoing and/or other problems, it is an aspect of the present general inventive concept to provide a wafer inspection system and a method thereof, in which the kinds of defect in the wafer are determined during a fabricating procedure, so that it is possible to instantly and correctly determine whether a die on the wafer is a defective.

Additional aspects and advantages of the present general inventive concept will be set forth in part in the description which follows and, in part, will be obvious from the description, or may be learned by practice of the general inventive concept.

The foregoing and/or other aspects of the present general inventive concept may be achieved by providing a wafer inspection system comprising an electrical testing part to control a probe to come in contact with a pad of a wafer and to perform a predetermined electrical test, a defect detecting part to detect a defect in the wafer according to the electrical test, a defect sorting part to sort the defect detected in the defect detecting part by an in-line method, and a defective determining part to determine whether the wafer is a defective according to a sorting result of the defect sorting part.

According to an aspect of the present general inventive concept, the defect sorting part may comprise an image pickup part to photograph a defect image containing the defect of the wafer detected by the defect detecting part, and a signal processing part to process the defect image from the image pickup part to sort the defect.

According to another aspect of the present general inventive concept, the signal processing part can remove noise from the defect image and can calculate an edge to determine a position of the pad.

According to yet another aspect of the present general inventive concept, the signal processing part can calculate a contact position of the probe and can calculate a distance between the contact position of the probe and a boundary line of the pad to determine a degree of a contact defect (CL) between the probe and the pad.

According to still another aspect of the present general inventive concept, the signal processing part can divide the boundary line of the pad into at least one region boundary line, can quantize the region boundary line to determine a transformation degree of the pad, and can determine the degree of the contact defect between the probe and the pad according to the transformation degree.

According to another aspect of the present general inventive concept, the signal processing part can calculate average block brightness of a plurality of sub-blocks including one part of the boundary line of the pad, and can determine the degree of the contact defect between the probe and the pad according to a determination of whether there is the sub-block having an average value of the calculated average block brightness lower than a predetermined allowable value.

According to another aspect of the present general inventive concept, the predetermined allowable brightness can be set according to the average value of the average block brightness of the sub-blocks.

According to another aspect of the present general inventive concept, the signal processing part can calculate a difference in the average block brightness between the adjacent sub-blocks when there is no sub-block having the average value of the calculated average block brightness lower than the predetermined allowable value, and can determine the degree of the contact defect between the probe and the pad according to the difference in the average block brightness larger than a predetermined reference value.

According to another aspect of the present general inventive concept, the signal processing part can compare a partial color extracted from the defect image with an ink color used in a predetermined process, calculate a centroid of a color region when the partial color is equal to the ink color, select a predetermined number of test pixels forming a boundary line of the color region, calculate a distance between the test pixels and the centroid, and determine the defect as an ink mark when the number of test pixels placed beyond a predetermined allowable distance is within a predetermined critical number.

According to another aspect of the present general inventive concept, the signal processing part can calculate an edge image from the defect image, and calculate an oblique by calculating an angle and a length of a line formed by an edge of the edge image with respect to a predetermined coordinate axis.

According to another aspect of the present general inventive concept, the signal processing part can remove noise from the defect image to calculate the edge, calculate an edge line of a closed curve of the edge image, and compare brightness in an inside and an outside of the closed curve, and determine the defect as a particle when a difference in the brightness between the inside and the outside of the closed curve is larger than a predetermined allowable range.

According to another aspect of the present general inventive concept, the defect sorting part can sort the defect detected by the defect detecting part into a defect list including at least one of the particle, the ink mark, the scratch, and the pad defect.

The foregoing and/or other aspects of the present general inventive concept may also be achieved by providing a method of inspecting a wafer, the method comprising performing a predetermined electrical test by controlling a probe to be contact with a pad of the wafer, calculating a defect position of the wafer through the electrical test, sorting a detected defect by an in-line method using the defect position, and determining whether the wafer is a defective according to a sorting result.

BRIEF DESCRIPTION OF THE DRAWINGS

The above and/or other aspects and advantages of the present general inventive concept will become apparent and more readily appreciated from the following description of the embodiments, taken in conjunction with the accompany drawings of which.

DETAILED DESCRIPTION OF THE PREFERRED EMBODIMENTS

Figure 1:
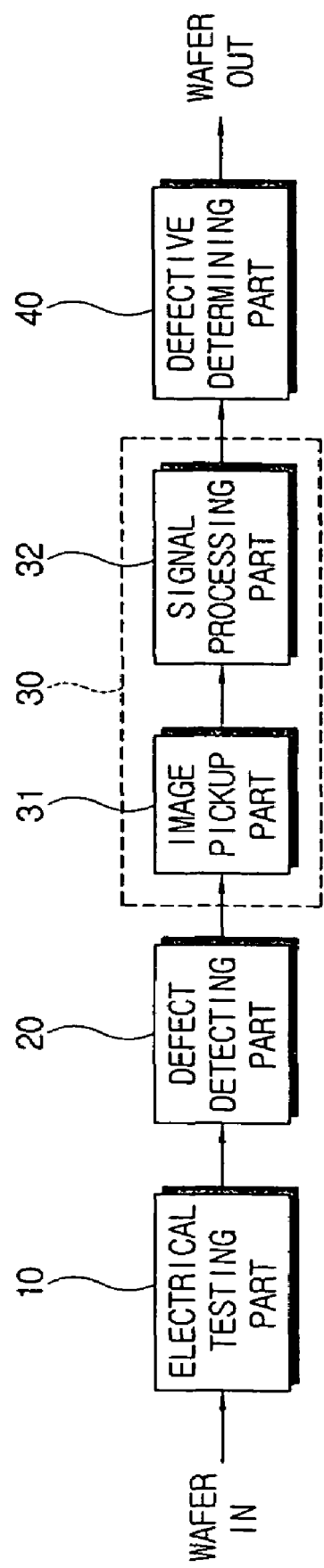
FIG. 1 is a block diagram of a wafer inspection system according to an embodiment of the present general inventive concept.

Reference will now be made in detail to the embodiments of the present general inventive concept, examples of which are illustrated in the accompanying drawings, wherein like reference numerals refer to like elements throughout. The embodiments are described below in order to explain the present general inventive concept by referring to the figures.

As shown in FIG. 1, a wafer inspection system according to an embodiment of the present general inventive concept may comprise an electrical testing part 10, a defect detecting part 20, a defect sorting part 30, and a defective determining part 40.

The electrical testing part 10 can control a probe to be in contact with a pad of a die after loading a die-mounted wafer thereon, and can perform a predetermined electrical test process. Here, the electrical test process may include a burn-in process to test the durability of the die, a pre-laser process to supply an electrical current to the die to check a defective die according to an operation state, and a laser repair process to scan and repair the defective die with a laser, etc.

After the electrical test process, the wafer can be transferred to the defect detecting part 20. Then, the defect detecting part 20 can detect at least one defect of the wafer and can store information about the defect.

The defect sorting part 30 can sort the defect detected in the defect detecting part 20 by an in-line method. Here, the in-line method indicates that the detected defect of the wafer can be sorted in sequence according to a fabricating speed and a fabricating sequence.

The defect sorting part 30 may comprise an image pickup part 31 and a signal processing part 32.

The image pickup part 31 can photograph a defect image corresponding to a region having the defect detected in the defect detecting part 20. The image pickup part 31 may comprise a stage to move to the region to be photographed, an imaging device, such as a CCD (charge coupled device) camera, to generate an image corresponding to the defect, and an optical device to control a magnifying power to adjust the image.

The signal processing part 32 can analyze the defect image taken by the image pickup part 31 and can sort the defect according to the kinds and the degrees of the defect. Meanwhile, an algorithm performed in the signal processing part 32 will be described later in more detail.

The defective determining part 40 can determine whether the die is a defective, namely a bad or good thing (a non-workable or workable die), according to the sorting result of the defect sorting part 30. Here, a standard for determining the defective die according to the sorting result of the defect sorting part 30 may vary according to a system design.

During the inspection process, the wafer can sequentially pass through the electrical testing part 10, the defect detecting part 20, the defect sorting part 30, and the defective determining part 40. At this time, the number of the parts, on which the inspection process is relatively slowly performed, may be larger than the number of parts, on which the inspection process is relatively quickly performed, thereby preventing an inspection speed of the inspection process from slackening. Further, some of the foregoing parts may be incorporated and used as one subordinate assembly.

Figure 2:
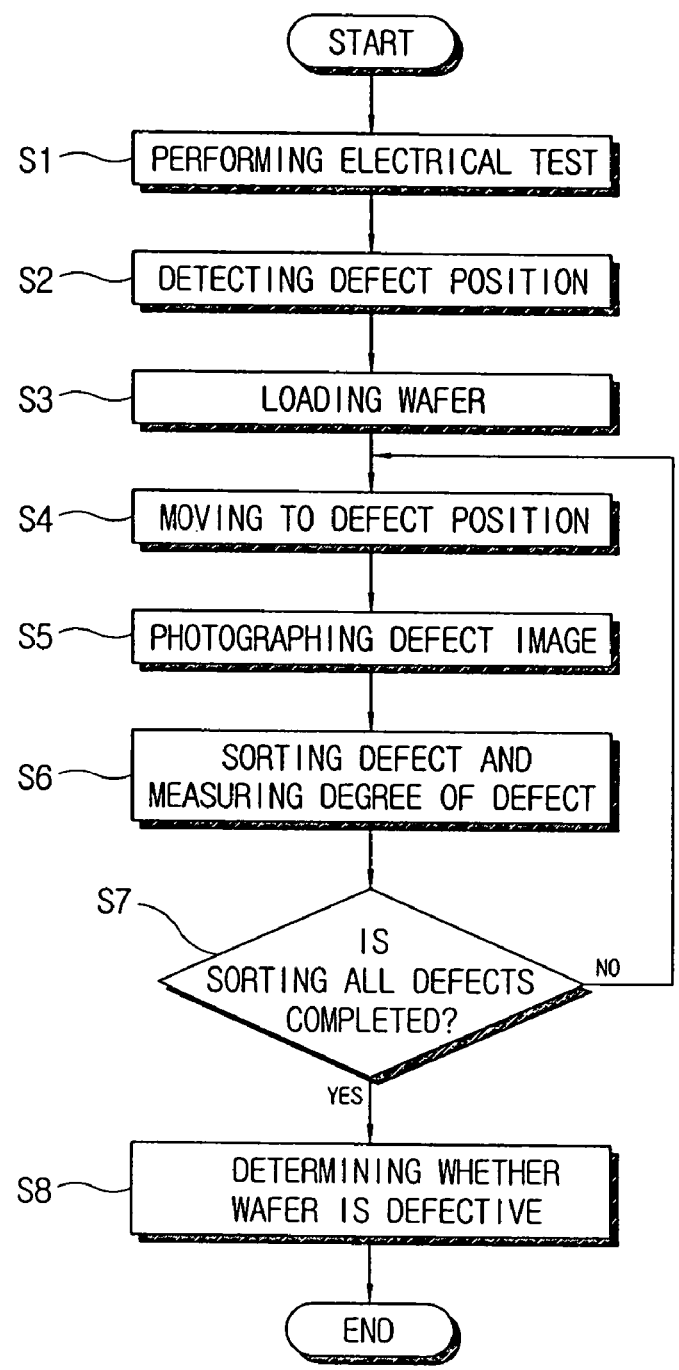
FIG. 2 is a flowchart showing a method of inspecting a wafer according to another embodiment of the present general inventive concept.

FIG. 2 is a flowchart showing a method of inspecting a wafer according to another embodiment of the present general inventive concept. Hereinbelow, a control process of the wafer inspection system of FIG. 1 to perform the inspecting method will be described in more detail with reference to FIGS. 1 and 2.

First, the wafer can be loaded in the electrical testing part 10, and then the probe can come in contact with the pad of each die to supply an electrical current thereto, thereby starting the electrical test process. Here, the electrical test process can be performed to cause the die to have even a macro defect as compared with other processes, so that the process to detect and sort the defect can be performed after the electrical test process.

In a case where the electrical test process determines that the wafer is abnormal, the foregoing laser repair process can be performed and then a post laser process can also be performed to recheck whether the wafer operates normally or abnormally.

After the electrical test process, the wafer can be transferred to the defect detecting part 20. The defect detecting part 20 can detect whether the defect exists or not, and a position of the defect, and can store information about the detected position of the defect in operation S2, thereby transmitting the information to the defect sorting part 30.

In operation S3, the wafer whose defect is detected can be loaded on the defect sorting part 30. In operation S4, a position of the wafer can be adjusted to allow a defective position (detected position of the defect) of the wafer to be photographed.

In operation S5, the image pickup part 31 can photograph the defective position of the wafer and can store it as image data.

In operation S6, the signal processing part 32 can process and analyze the image data, thereby sorting the kinds of the defect and determining the degrees of the defect. Here, the kinds of the defect may include an abnormal contact between the probe and the pad, a pad damage, particle contents, a scratch, an ink mark, or the like. Further, the degrees of the defect may be determined variously according to manufacturers or vendors.

After one detective position is photographed and its defect is sorted, it can be determined that all defects are sorted or not in operation S7. In a case where there is a non-sorted defect, the image pickup part 31 can change a photographing position thereof and can photograph the defect in sequence (operations S4 and S5), and the signal processing part 32 can analyze the image data of the defect and can sort the defect (operation S6).

After all defects are completely sorted, the defective determining part 40 can determine whether the die is a defective in operation S8. Here, a standard for determining the defective may vary according to the vendors in consideration of the kinds of the detected defect, repairability, a determination of whether the die can be normally operated, an outer appearance, etc.

In the foregoing embodiment, a yield can be improved due to an increment of a processing speed, elimination of the defect, etc. Further, an error occurring due to macrography of an inspector can be minimized, and manufacturing costs or the like can be decreased.

Hereinbelow, an algorithm performed in the signal processing part 32 of FIG. 1 will be described in more detail with reference to FIGS. 3 through 10B.

Figure 3:
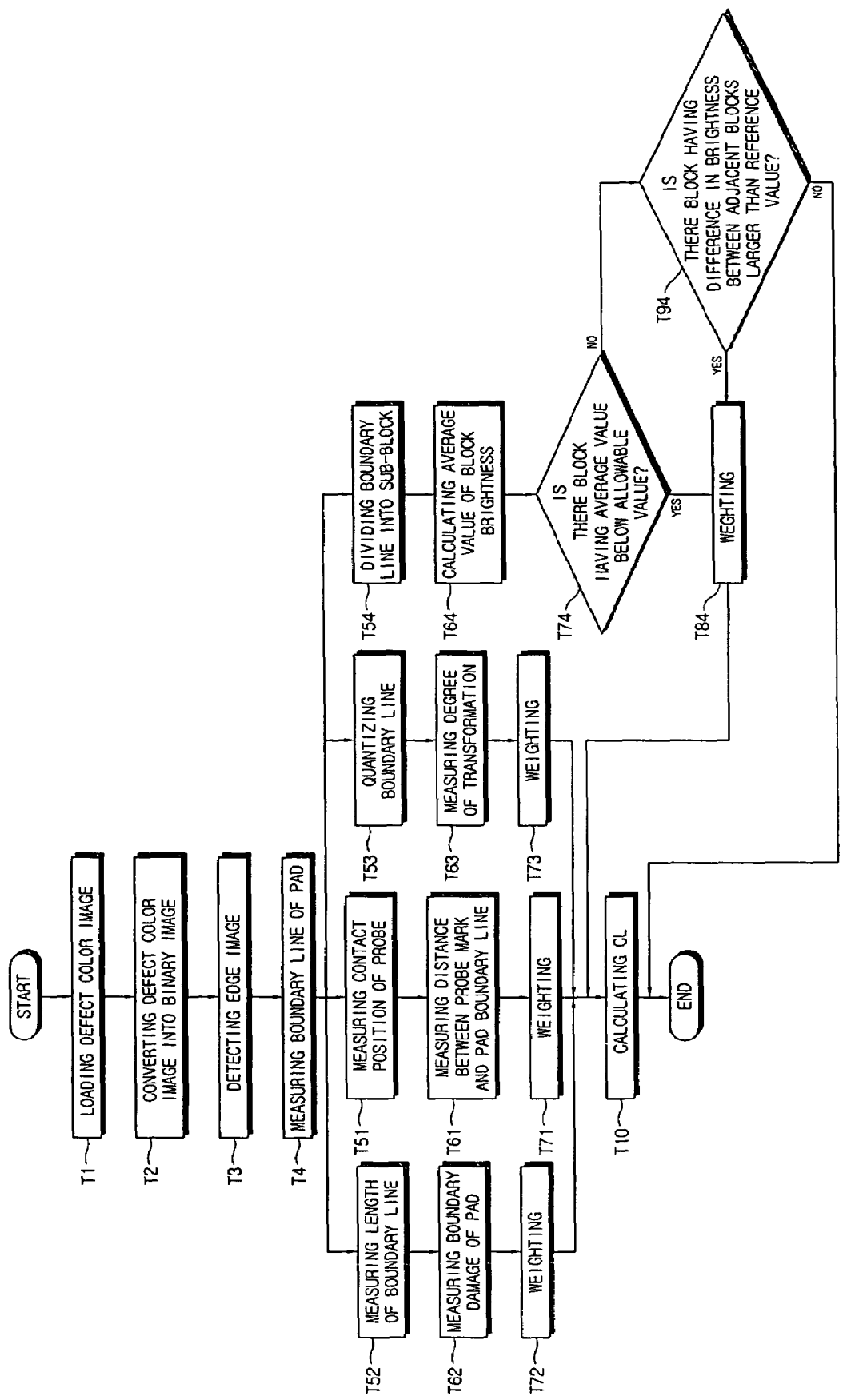
FIG. 3 is a flowchart showing to determine a contact state between a pad and a probe according to another embodiment of the present general inventive concept.

FIG. 3 is a flowchart of the algorithm to determine a contact state between a pad and a probe according to another embodiment of the present general inventive concept.

Referring to FIGS. 1 and 3, a defect color image photographed by the image pickup part 31 can be loaded into the signal processing part 32 in operation T1.

In operation T2, the signal processing part 32 can extract a gray binary (black and white) image from the defect color image. In this operation, a smoothing algorithm, a morphology algorithm, etc., can be used to convert defect color image into the gray level image (binary image).

In operation T3, the signal processing part 32 can extract an edge image using an edge-detection algorithm, such as a canny edge detector.

In operation T4, a connected line can be extracted (defined) from the edge image, and an area formed by the connected line can be filtered (defined), thereby defining a boundary line forming the pad. At this time, previously stored conditions, such as a shape, a size, a length, etc., of the pad can be used to define the pad.

On the basis of the defined area and the defined outer boundary line of the pad, it is possible to measure the contact position of the probe, whether the boundary line of the pad is damaged, the damaged degree of the pad, the particle effect, etc., thereby determining a total degree of the defect. Each foregoing measurement will be described hereinbelow in sequence.

To estimate the contact state of the probe, the contact position of the probe can be detected depending on the edge image in operation T51. In operation T61, a distance from the detected contact position to the boundary line can be measured. As described above, since the probe is in contact with a center of the pad, the measured distance may not be larger than a length of a normal pad.

In operation T71, the measured distance can be weighted with a predetermined value. In operation T10, the degree of the contact defect (hereinafter, referred to as "CL: confidence level") can be determined according to a weight of a weighting operation T71.

Then, to estimate whether the boundary line of the pad is damaged, the boundary line of the pad can be measured in length in operation T52. Then, the measured length is compared with the length of the normal pad, so that it can be measured whether the boundary line of the pad is damaged and the degree of the damage can be measured, in operation T62. Also, coordinate transformation in a predetermined coordinate system can be used to determine whether pixels forming the boundary line of the pad are continuous or discontinuous, thereby measuring whether the boundary line of the pad is damaged. Then, the measured result can be weighted with a predetermined value in operation T72, and in operation T10, the weighted result can be used in CL calculation operation in operation T10.

As another method of measuring the damage on the boundary line of the pad, there is a method of measuring a transformation degree of the boundary line. For this measurement, in operation T53, the boundary line of the pad can be quantized into discrete levels. Then, in operation T63, a length of each boundary line according to the discrete levels can be measured, thereby measuring the transformation degree. Then, in operation T73, the transformation degree can be weighted according to the respective discrete levels and the lengths, or the transformation itself can be weighted, and therefore, in operation T10, the weighted result can be used in the CL calculation operation.

Then, it can be determined whether the boundary line of the pad is covered with the particle.

First, in operation T54, the boundary line of the pad can be divided into a plurality of small-sized sub-blocks, and then, in operation T64, an average brightness of the sub-blocks can be calculated.

Then, in operation T74, it is determined whether the sub-block having the average brightness equal to or less than an allowable brightness exists. In the case where there is the sub-block having the average brightness less than the allowable brightness, the pad can be regarded as its boundary line is covered with the particle, and in operation T84, the average brightness can be weighted. Therefore, in operation T10, the weighted result can be used in the CL calculation operation. Here, the allowable brightness can be set to a value equal to or less than the average brightness, and therefore effectively used in detecting the particle regardless of a process variation.

On the other hand, in a case where there is no sub-block having the average brightness less than the allowable brightness, in operation T94, a brightness difference in the average brightness between neighboring blocks can be calculated to determine whether the particle exists according to a determination of whether the brightness difference is larger than a predetermined standard value. In a case where the average brightness between the blocks is transformed more largely than the standard value, it can be determined that the particle exists in operation T84, the average brightness is weighted. Therefore, in operation T10, a value of the weighted result can be used in the CL calculation operation.

Then, the degree of the defective contact between the pad and the probe can be determined according to the sizes of the calculated CL.

Figure 4:
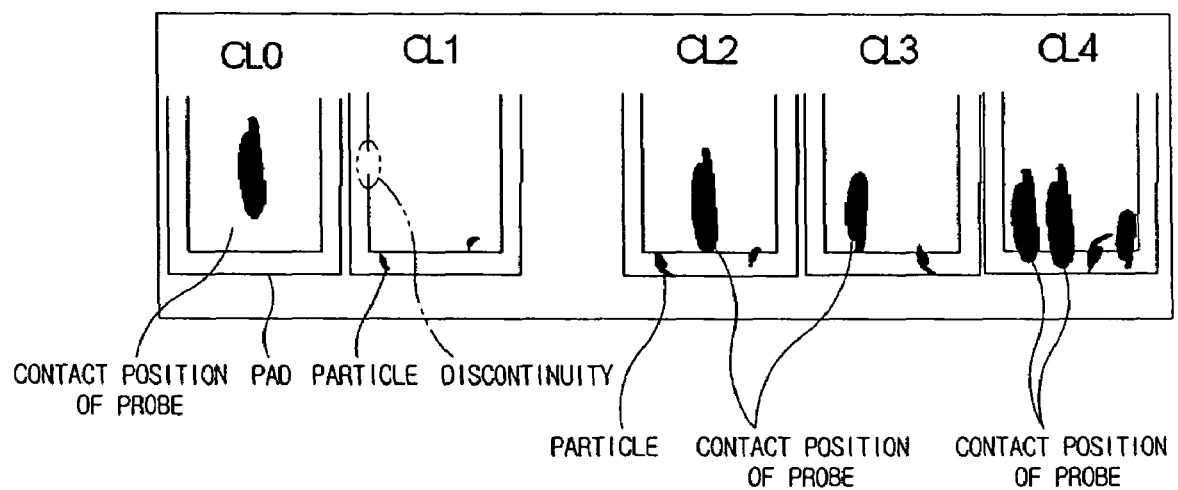
FIG. 4 is a view showing a defect degree in the contact state between the pad and the probe according to a size of a confidence level (CL) in the method of FIG. 3.

FIG. 4 is a view showing a defect degree in the contact between the pad and the probe by way of an example according to the sizes of the calculated CL. As shown in FIG. 4, the pad may have a dual boundary line. Further, CL0~CL4 are graded according to the levels of the CL based on the weighted detected result, wherein the CL0 is the smallest CL, and the size of the CL is increased as it becomes near the CL4.

Referring to FIG. 4, in the pad corresponding to the CL0, the probe can be placed in the center of the pad.

In the case of the CL1, two particles can be detected adjacent to inner and outer boundary lines of the pad. Further, there is a discontinuous portion on a left side of the inner boundary line of the pad. However, in this process, the damage and the like in the boundary line may not be detected.

In the case of the CL2, the boundary line of the pad and the contact position of the probe come in contact with each other. Further, the inner boundary line of the pad is discontinuous and transformed due to the particle. Also, the particle can be detected in the inner boundary line and between the outer and inner boundary lines.

In the case of the CL3 and the CL4, the defect due to the probe contact and the particle is deteriorated.

Meanwhile, when the probe is in contact with the outside of the pad, the outer boundary line of the pad can be discontinuous and transformed, but it is not shown in FIG. 4. Further, the contact position of the probe, the discontinuity and the transformation of the boundary line, an impossible detection state due to the particle, etc., can be compositively interacted. That is, when the outer boundary line has discontinuity and the particle is detected at the same position, the weight for the result of the detected discontinuity may vary compared to the case that there is no particle. Such weight and variation degree may be arbitrarily designed in the wafer inspection system.

As another sort of the defect besides the defective contact between the probe and the pad, there is the ink mark.

Figure 5:
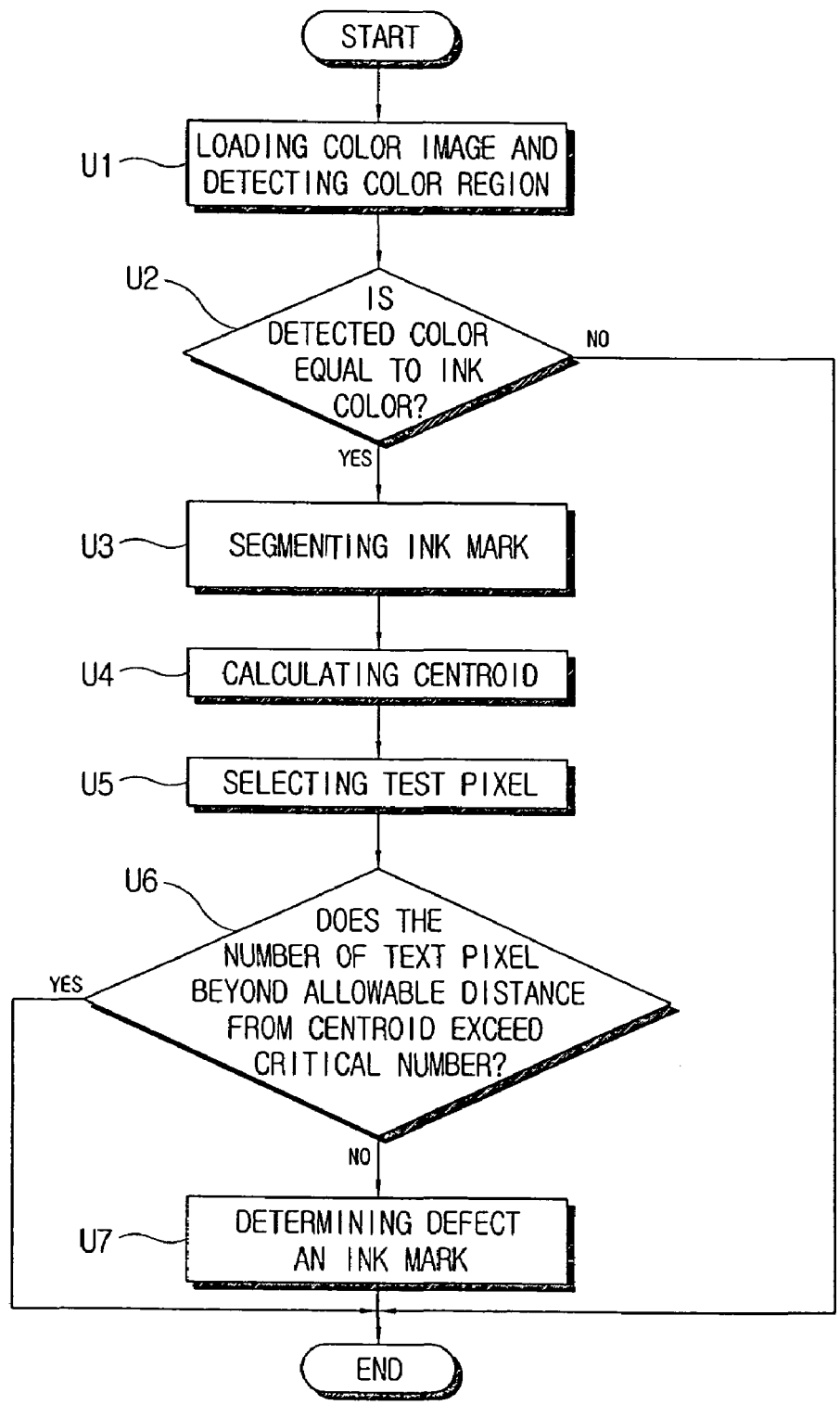
FIG. 5 is a flowchart of detecting an ink mark according to another embodiment of the present general inventive concept.
Figure 6A:
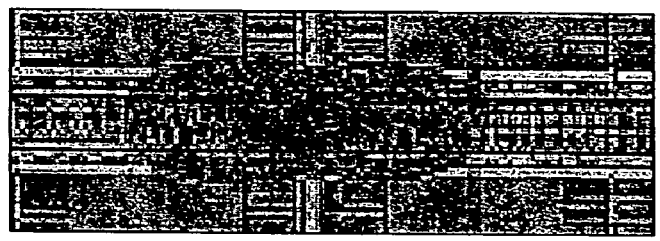
FIGS. 6A and 6B are views showing pictures corresponding to the detection of the ink mark in the method of FIG. 5.
Figure 6B:
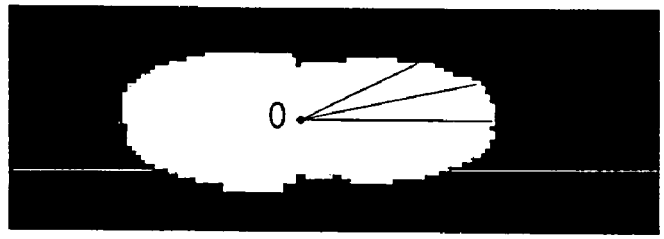

FIG. 5 is a flowchart showing a method detecting an ink mark according to another embodiment of the present general inventive concept, and FIGS. 6A and 6B are views showing pictures (images) corresponding to the detection of the ink mark in the method of FIG. 5.

Referring to FIGS. 1 and 5 through 6B, in operation U1, the signal processing part 32 can load a color image from the defective position photographed by the image pickup part 31, and can detect a color region according to the respective colors of the color image.

In operation U2, it can be determined whether there is a predetermined ink color used in the process and equal to one color among the detected colors. For example, if a difference between a detected RGB (red, green, blue) gradation according to pixels of the color image and a gradation of the ink color is of below a predetermined deviation, they can be determined as the same color.

When the detected color is equal to the ink color used in the process, it can be determined whether a shape of the color region is circular as shown in FIG. 6A.

First, as shown in FIG. 6B, the color region to be suspected as the ink mark can be divided in operation U3, and a centroid "O" of the color region can be calculated in operation U4.

In operation U5, a predetermined number of test pixels can be selected from the outer boundary line of the color region, and a distance from each test pixel to the centroid "O" can be calculated. Here, the test pixels can be selected to have regular angle intervals from each other with respect to the centroid "O."

In operation U6, it can be determined that the calculated distances beyond a predetermined allowable range exceed a critical number. In a case where the calculated distances beyond the allowable range exceed the critical number, the ink can not be determined as a circular shape, so that the ink mark is not detected as the defect. Here, the allowable range can be limited within an allowable deviation from an average value of the calculated distance.

In a case where the calculated distances below the allowable range do not exceed the critical number, the ink mark like a circular shape can be sorted as the defect in operation U6.

As another sort of the defect, there is an oblique scratch.

Figure 7:
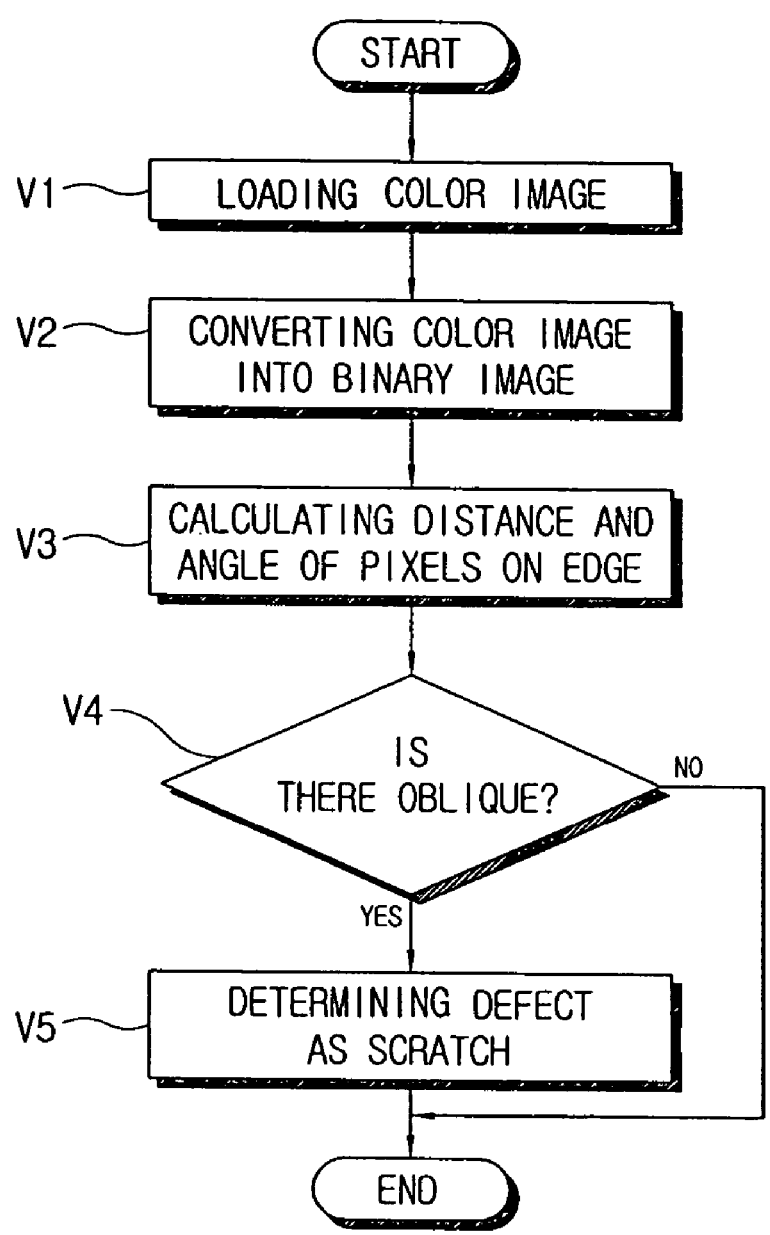
FIG. 7 is a flowchart showing a method of detecting a scratch according to another embodiment of the present general inventive concept.
Figure 8A:
FIGS. 8A through 8C are views showing pictures corresponding to the scratch detection in the method of FIG. 7.
Figure 8B:
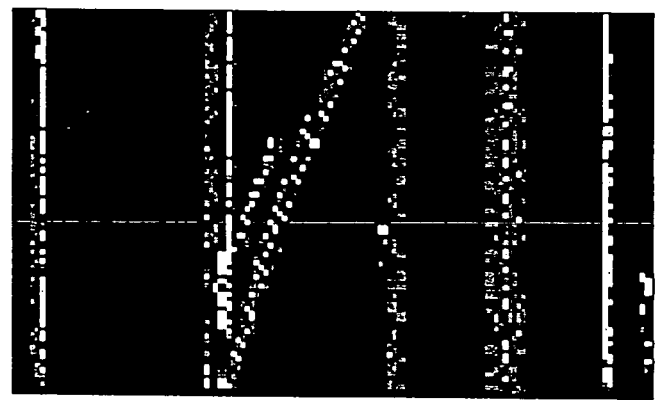
Figure 8C:
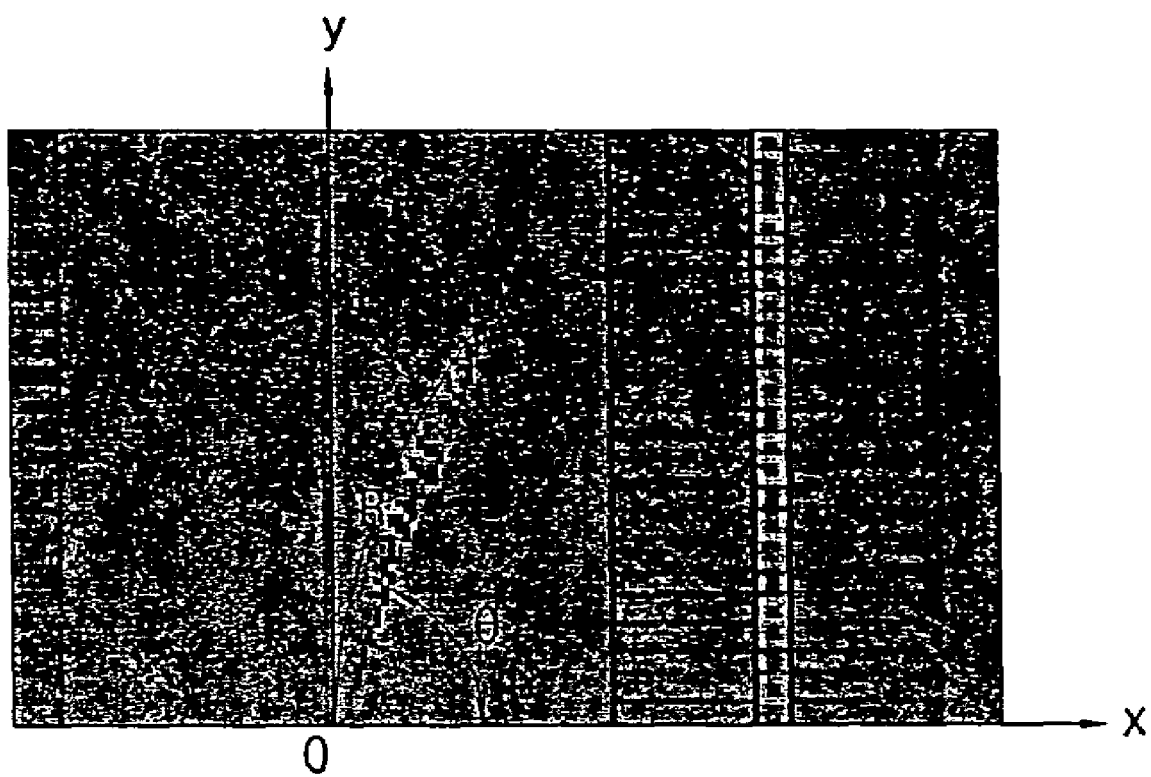

FIG. 7 is a flowchart showing a method of detecting a scratch according to another embodiment of the present general inventive concept, and FIGS. 8A through 8C are views showing pictures corresponding to the scratch detection in the method of FIG. 7.

Referring to FIGS. 1 and 7 through 8C, the signal processing part 32 can load a defective color image (refer to FIG. 8A) from the image pickup part 31 in operation V1.

In operation V2, the color image can be converted into a binary image through algorithm, such as Gaussian smoothing, canny edge or the like as shown in FIG. 8B. Here, a predetermined region of the binary image may be selected.

As shown in FIG. 8C, a rectilinear coordinate system having an axis parallel to a rectangular boundary line of the die or the pad can be transformed into a cylindrical coordinate system having an arbitrary origin "O", and a distance "R" and an angle "θ" from the origin "O" to pixels forming the edge can be calculated in operation V3.

Here, the origin "O" can be set as a point at which one axis of the rectilinear coordinate system and a predetermined line cross each other. Further, the coordinate system can be transformed through the Hough transform, etc.

In operation V4, it can be determined whether the continuous pixels having an angle "θ" except for an angle of 0° or 90° have a predetermined length or more. In a case where the continuous pixels having the angle "θ" except for an angle of 0° or 90° have the predetermined length or more in operation V5, it can be determined that there is an oblique scratch.

Further, as another sort of the defect, there is the particle.

Figure 9:
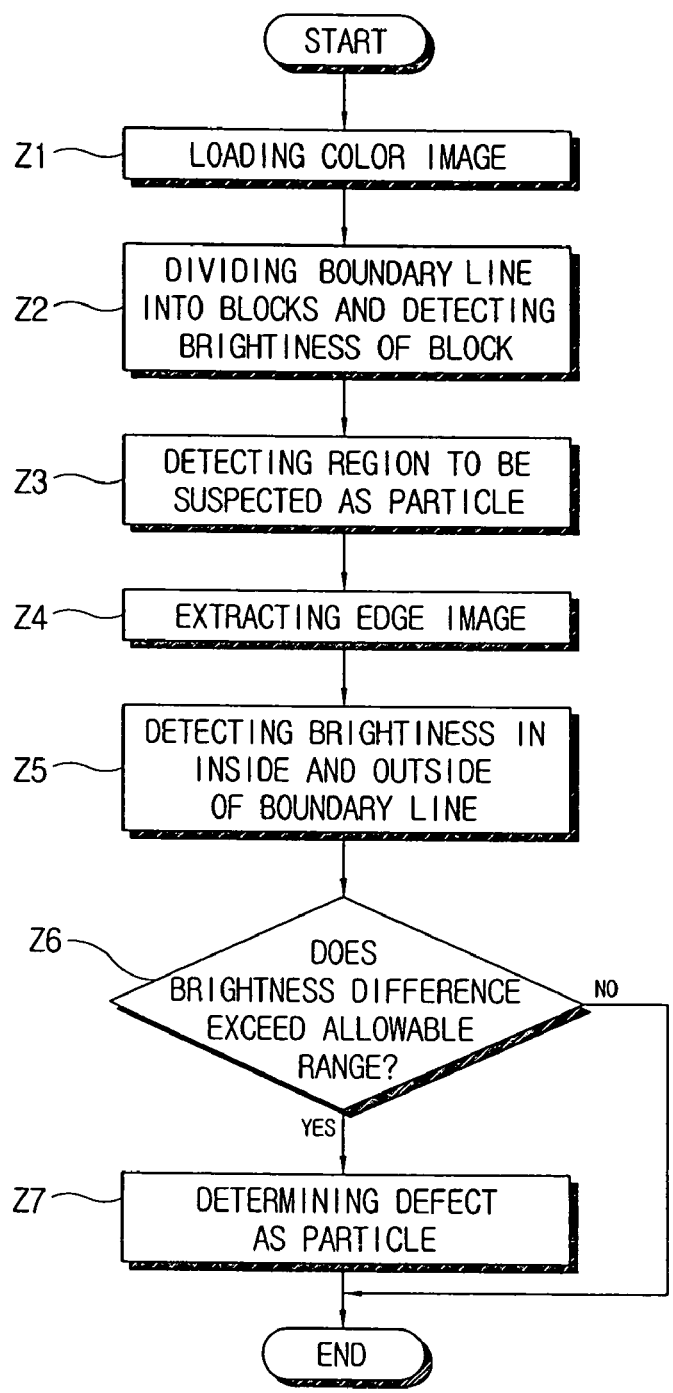
FIG. 9 is a flowchart showing a method detecting a particle according to another embodiment of the present general inventive concept.
Figure 10A:
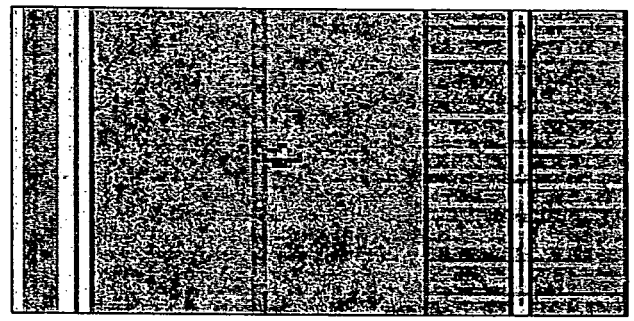
FIGS. 10A and 10B are views showing pictures corresponding to the particle detection in the method of FIG. 9.
Figure 10B:
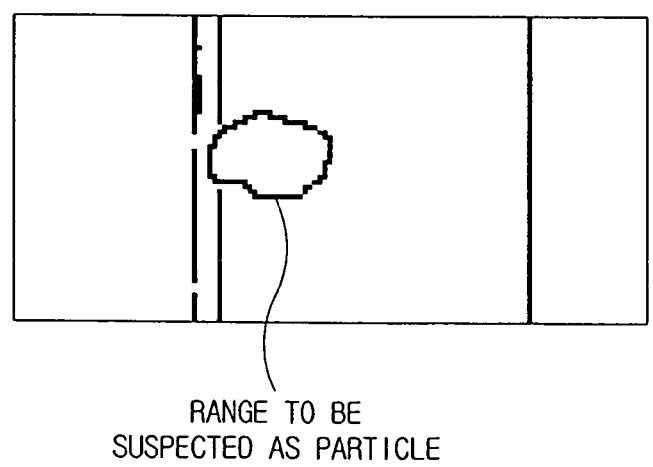

FIG. 9 is a flowchart showing a method of detecting a particle according to another embodiment of the present general inventive concept, and FIGS. 10A and 10B are views showing pictures corresponding to the particle detection in the method of FIG. 9.

Referring to FIGS. 1 and 9 through 10B, the signal processing part 32 can load a defective color image (refer to FIG. 10A) from the image pickup part 31 in operation Z1.

In operation Z, noise of the color image can be removed, and the color image can be divided into predetermined sized blocks. In operation Z3, a threshold value having a predetermined deviation from an average brightness according to the blocks can be used to determine a region to be suspected (regarded) as the particle as shown in FIG. 10B.

In operation Z4, an edge image can be extracted, and an edge line of a closed curve can be detected. In operation Z5, brightness can be detected in an inside and an outside of the closed curve. In operation Z6, it can be determined whether a brightness difference between the inside and the outside of the closed curve is beyond an allowable range. In a case where the brightness difference between the inside and the outside of the closed curve is beyond the allowable range, a range to be suspected as the particle can finally be determined as the particle in operation 27.

As described above with reference to FIGS. 3 through 10B, various algorithms for sorting the defect of the wafer can be compositively applied to one defect.

On the other hand, it may not apply the same standard to determine the degree of the defect as a cause of the defective according to the kinds of the defect. For example, the same defect may be detected as both the ink mark and the particle, and both the ink mark and the particle can be used to determined whether the pad is damaged. Therefore, when the defect is determined as the ink mark, a system designer can adjust a weight to prevent the defect from being determined as the particle.

Thus, the defective determining part 40 can finally determine whether the die having the defect is a defective on the basis of the sorting result of the defect sorting part 30.

As described above, the present general inventive concept can provide a wafer inspection system and a method thereof, in which a state of a die can be instantly and correctly determined according to the kinds and the degrees of defect in the die, thereby improving a yield and reducing time and cost taken to inspect a wafer.

Although a few embodiments of the present general inventive concept have been shown and described, it will be appreciated by those skilled in the art that changes may be made in these embodiments without departing from the principles and spirit of the invention, the scope of which is defined in the appended claims and their equivalents.

What is claimed is:

1. A wafer inspection system comprising:
   an electrical testing part to control a probe to be in contact with a pad of a wafer and to perform a predetermined electrical test;
   a defect detecting part to detect a defect in the wafer through the electrical test;
   a defect sorting part to sort the defect detected in the defect detecting part by an in-line method, comprising:
   an image pickup part to photograph a defect image containing the defect of the wafer detected by the defect detecting part, and
   a signal processing part to process the defect image from the image pickup part so that the defect is detected, to calculate a binary image from the defect image, and to calculate an oblique scratch according to the binary image with respect to a predetermined coordinate axis; and
   a defective determining part to determine whether the wafer is defective according to a sorting result of the defect sorting part.

2. The wafer inspection system of claim 1, wherein the signal processing part removes noise from the defect image to calculate an edge to determine a position of the pad.

3. The wafer inspection system of claim 2, wherein the signal processing part calculates a contact position of the probe and calculates a distance between the contact position of the probe and a boundary line of the pad to determine a degree of a contact defect (CL) between the probe and the pad.

4. The wafer inspection system of claim 2, wherein the signal processing part divides a boundary line of the pad into at least one region boundary line, quantizes the region boundary line to determine a transformation degree of the pad, and determines a degree of a contact defect between the probe and the pad according to the transformation degree.

5. The wafer inspection system of claim 2, wherein the signal processing part divides the defect image into a plurality of sub-blocks, calculates an average block brightness of the plurality of sub-blocks including at least one part of a boundary line of the pad, and determines a degree of a contact defect between the probe and the pad according to a determination of whether there is the sub-block having an average value of the calculated average block brightness lower than a predetermined allowable brightness value.

6. The wafer inspection system of claim 5, wherein the allowable brightness value is set according to the average value of the average block brightness of the sub-blocks.

7. The wafer inspection system of claim 5, wherein the signal processing part calculates a difference in the average block brightness between the adjacent sub-blocks when there is no sub-block having the average value of the calculated average block brightness lower than the predetermined allowable brightness value, and determines the degree of the contact defect between the probe and the pad according to the difference in the average block brightness larger than a predetermined reference value.

8. The wafer inspection system of claim 1, wherein the signal processing part:
   compares a partial color extracted from the defect image with an ink color used in a predetermined process;
   calculates a centroid of the color region when the partial color is equal to the ink color;
   selects a predetermined number of test pixels forming a boundary line of the color region;
   calculates a distance between the test pixels and the centroid; and
   determines the defect as an ink mark when the number of test pixels placed beyond a predetermined allowable distance is within a predetermined critical number.

9. The wafer inspection system of claim 1, wherein the binary image is an edge image and the oblique scratch is calculated according to an angle and a length of a line formed by an edge of the edge image with respect to the predetermined coordinate axis.

10. The wafer inspection system of claim 1, wherein the signal processing part:
  removes noise from the defect image to calculate an edge;
  calculates an edge line of a closed curve from an edge of the defect image;
  compares brightness in an inside and an outside of the closed curve; and
  determines the defect as a particle when a difference in brightness between the inside and the outside of the closed curve is larger than a predetermined allowable range as a result of the comparison.

11. The wafer inspection system of claim 1, wherein the defect sorting part sorts the defect detected by the defect detecting part into a defect list including at least one of a particle, an ink mark, a scratch, an abnormal contact between the probe and the pad, pad damage, and a pad defect.

12. The wafer inspection system of claim 1, wherein the defective determining part generates a weight according to a degree or a kind of the defect to calculate a CL to be used in determining whether the wafer is defective.

13. The wafer inspection system of claim 1, wherein the in-line method comprises sorting the detected defect in sequence according to a fabricating speed and a fabricating sequence of the wafer.

14. The wafer inspection system of claim 1, wherein the defective determining part determines the defect according to a relationship between the defect and a boundary line of the pad.

15. The wafer inspection system of claim 14, wherein the relationship between the defect and the boundary comprises at least one of a distance, an angle, and a brightness.

16. The wafer inspection system of claim 1, wherein the defective determining part determines the defect according to a relationship between the defect and a centroid of a predetermined area of the pad.

17. The wafer inspection system of claim 1, wherein the defective determining part determines the defect according to a length of a boundary line of the pad.

18. A wafer inspection system to sort a plurality of defects, comprising:
  a defect detecting part to detect a plurality of defects in the wafer;
  a defect sorting part to sort the plurality of defects detected in the defect detecting part in sequence according to a fabricating speed and a fabricating sequence, and to calculate an edge line of a closed curve from an edge of the defect image and to determine the defect as a particle when a difference in brightness between the inside and the outside of the closed curve is larger than a predetermined allowable range; and
  a defective determining part to determine whether the wafer is defective according to a sorting result of the defect sorting part.

* * * * *